US008852828B2

(12) United States Patent
Azakami et al.

(10) Patent No.: US 8,852,828 B2
(45) Date of Patent: Oct. 7, 2014

(54) VOLUME HOLOGRAM PHOTOSENSITIVE COMPOSITION

(75) Inventors: Minoru Azakami, Tokyo-To (JP); Yoshihito Maeno, Tokyo-To (JP); Hiroyuki Ohtaki, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 794 days.

(21) Appl. No.: 11/481,405

(22) Filed: Jul. 5, 2006

(65) Prior Publication Data

US 2007/0009807 A1    Jan. 11, 2007

(30) Foreign Application Priority Data

Jul. 6, 2005    (JP) .................................. 2005-197537

(51) Int. Cl.
*G03H 1/02*    (2006.01)
*G03F 7/038*    (2006.01)
*G03F 7/00*    (2006.01)

(52) U.S. Cl.
CPC ................ *G03F 7/001* (2013.01); *G03F 7/038* (2013.01); *G03H 2001/0264* (2013.01); *G03H 1/02* (2013.01); *G03H 2260/12* (2013.01)
USPC ............. 430/1; 430/2; 430/280.1; 430/281.1; 430/290; 359/3

(58) Field of Classification Search
None
See application file for complete search history.

(56) References Cited

U.S. PATENT DOCUMENTS 5,098,803 A * 3/1992 Monroe et al. ..................... 430/1
5,698,345 A * 12/1997 Ohe et al. ........................... 430/2
5,776,634 A * 7/1998 Ohkuma et al. .................... 430/2
6,103,454 A * 8/2000 Dhar et al. ...................... 430/290
6,627,354 B1 * 9/2003 Chandross et al. ................. 430/1
6,765,061 B2 * 7/2004 Dhar et al. ..................... 525/123
7,323,275 B2 * 1/2008 Otaki et al. ........................ 430/1
2002/0142227 A1 * 10/2002 Dhar et al. ......................... 430/1
2004/0137334 A1    7/2004 Otaki et al.
2005/0196679 A1 * 9/2005 Hayase et al. ..................... 430/1

FOREIGN PATENT DOCUMENTS

| JP | 06-043634 | | 2/1994 |
| JP | 2664234 | | 6/1997 |
| JP | 2000-122515 | * | 4/2000 |
| JP | 2000-310932 | | 11/2000 |
| JP | 2002-236439 | | 8/2002 |
| JP | 2004-191919 | | 7/2004 |
| JP | 2005-195952 | | 7/2005 |

OTHER PUBLICATIONS

Lucite international, ELVACITE 2051 Technical data sheet pp. 1-4 (Aug. 2002).*
Lucite international, ELVACITE 2008 Technical data sheet pp. 1-2 (Aug. 2002).*

* cited by examiner

*Primary Examiner* — Martin Angebranndt
(74) *Attorney, Agent, or Firm* — Burr & Brown, PLLC

(57) ABSTRACT

This invention provides a volume hologram photosensitive composition, which can realize a hologram having an excellent brightness and, at the same time, having excellent heat resistance and mechanical strength, and a photosensitive medium for volume hologram recording using the volume hologram photosensitive composition. The volume hologram photosensitive composition comprises at least a photopolymerizable monomer, a photopolymerization initiator, a sensitizing dye for sensitizing the initiator, and a binder resin. The binder resin comprises a heat curing resin, and optionally a thermoplastic resin, and the thermoplastic resin is contained in an amount of 0 to 25% by weight based on the total solid content of the photosensitive composition.

11 Claims, 1 Drawing Sheet

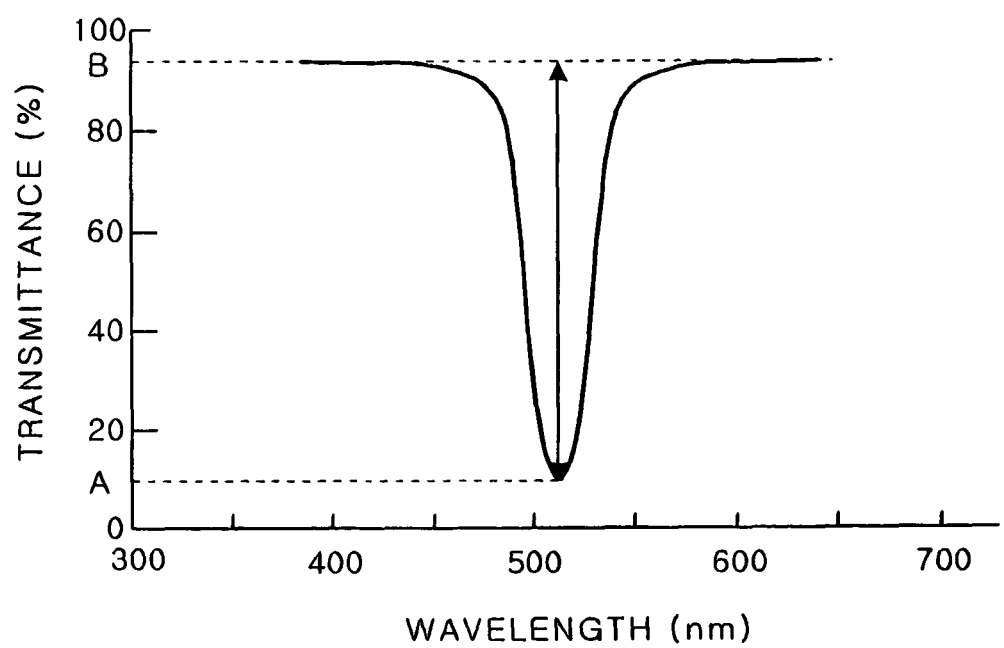

VOLUME HOLOGRAM PHOTOSENSITIVE COMPOSITION

BACKGROUND OF THE INVENTION

1. Field of the Invention

The present invention relates to a volume hologram photosensitive composition, a photosensitive medium for volume hologram recording using the composition, and a volume hologram using the same.

2. Background Art

Volume holograms are widely used in design, security and optical element applications, for example, because they can render an image three-dimensionally, have high diffraction efficiency and wavelength selectivity, and require advanced production techniques. Volume holograms are prepared by allowing object light and reference light, which are highly coherent and have the same wavelength, to interfere with each other and allowing the coherent light to enter a material for volume hologram recording to record, as interference fringes, three-dimensional information regarding the object in the inside of the material.

The interference fringes are recorded as refractive index modulation corresponding to the bright and dark parts of the coherent light. Excellent wavelength selectivity is one feature of the volume hologram, and only light of a particular angle or wavelength in a particular wavelength light source (incident light) can be diffracted for reproduction.

In recent years, in the production of volume holograms, attention has been made to a dry-type photosensitive composition for volume hologram recording that can eliminate the need to conduct wet development and can realize mass production. The dry-type photosensitive composition is composed mainly of a photoradically polymerizable monomer, a binder resin, a photoradical polymerization initiator, and a sensitizing dye and utilizes the difference in refractive index between a photopolymerizable monomer and a binder resin (for example, U.S. Pat. No. 2,664,234).

Specifically, upon interference exposure of a film of the photosensitive composition, photoradical polymerization is started in a high intensity light part, leading to diffusion migration of the photoradically polymerizable monomer. As a result, sparse and dense parts of the photoradically polymerizable monomer are provided depending upon the intensity of light according to an interference pattern, and this appears as a refractive index difference, whereby a hologram is developed. A large difference in refractive index between the photopolymerizable monomer and the binder resin and excellent storage stability after hologram formation are required of this dry-type photosensitive composition.

In order to satisfy the above requirements, for example, Japanese Patent Laid-Open No. 43634/1994 discloses a material for volume hologram recording, using a thermoplastic resin as a binder resin. The claimed advantage of this material is to enhance the diffusion migration of the photoradically polymerizable monomer and to realize a hologram having excellent brightness. Further, Japanese Patent Laid-Open No. 310932/2000 discloses a hologram recording material using a heat curing resin as a binder resin. The claimed advantage of this material is to realize a hologram having excellent film strength and heat resistance.

When the thermoplastic resin is used as the binder resin, the heat resistance and mechanical strength of the hologram are disadvantageously poor although the brightness of the hologram is improved. On the other hand, when the heat curing resin is used as the binder resin, maintaining a high level of refractive index modulation is not so easy and, thus, disadvantageously, a hologram having high brightness cannot be provided.

SUMMARY OF THE INVENTION

The present inventors have now found that, when a mixture of a heat curing resin and a thermoplastic resin at a predetermined mixing ratio is used as a binder resin, excellent recording properties (monomer migration capability) can be realized at the time of hologram recording without sacrificing heat resistance and mechanical strength. The present invention has been made based on such finding.

Accordingly, an object of the present invention is to provide a volume hologram photosensitive composition, which can realize a hologram having an excellent hologram brightness and, at the same time, having excellent heat resistance and mechanical strength, and a photosensitive medium for volume hologram recording using the volume hologram photosensitive composition.

According to the present invention, there is provided a volume hologram photosensitive composition comprising at least a photopolymerizable monomer, a photopolymerization initiator, a sensitizing dye for sensitizing the initiator, and a binder resin, characterized in that the binder resin comprises a heat curing resin, and optionally a thermoplastic resin, and the thermoplastic resin is contained in an amount of 0 to 25% by weight based on the total solid content of the photosensitive composition.

The present invention can realize a volume hologram photosensitive composition, which can realize a hologram having an excellent brightness and, at the same time, having excellent heat resistance and mechanical strength, and a photosensitive medium for volume hologram recording using the volume hologram photosensitive composition.

BRIEF DESCRIPTION OF THE DRAWINGS

FIG. 1 is a diagram showing an example of a spectral transmittance curve for a volume hologram.

DETAILED DESCRIPTION OF THE INVENTION

The volume hologram photosensitive composition according to the present invention and the photosensitive medium for volume hologram recording using the composition will be described.

Volume Hologram Photosensitive Composition

The volume hologram photosensitive composition according to the present invention comprises at least a photopolymerizable monomer, a photopolymerization initiator, a sensitizing dye for sensitizing the initiator, and a binder resin. Each component will be described.

(1) Binder Resin

The binder resin used in the present invention comprises a heat curing resin, and optionally a thermoplastic resin. The thermoplastic resin is contained in an amount of 0 to 25% by weight based on the total solid content of the photosensitive composition. A hologram, which can realize a high level of refractive index modulation and excellent mechanical properties, can be produced by using the heat curing resin as a main component of the binder resin and incorporating the thermoplastic resin in the above-defined amount range.

The mixing ratio between the heat curing resin and the thermoplastic resin in the binder resin varies depending upon the compatibility of the resins used. Preferably, however, the amount of the thermoplastic resin is 5 to 25% by weight based on the total solid content of the photosensitive composition.

When the mixture containing the thermoplastic resin in the above proportion is used as the binder resin, an enhancement in diffusion migration capability of reactive monomer species, which is an advantage of the thermoplastic resin, can be realized without sacrificing excellent heat resistance and mechanical strength advantageously achieved by using the heat curing resin. The reason for this has not been elucidated yet but is believed to be as follows. In the hologram, after a photosensitive layer is exposed to record a hologram, heating or ultraviolet irradiation is carried out for resin fixation. At the time of the exposure, when the diffusibility of the photopolymerizable monomer is higher, the refractive index modulation level is increased and, consequently, a hologram having higher brightness is provided. In this case, when a predetermined amount of a thermoplastic resin is contained in the binder resin, the diffusion migration capability of the monomer species is enhanced. Further, in fixing a hologram by heating or ultraviolet light irradiation after hologram recording, the heat curing resin or unreacted monomer is three-dimensionally crosslinked for curing. In this case, it is considered that, since the thermoplastic resin is fixed in a polymer chain network formed upon curing of the heat curing resin, the apparent glass transition temperature of the thermoplastic resin is increased.

When the content of the thermoplastic resin is 0 to 25% by weight based on the whole photosensitive composition, the thermoplastic resin does not substantially contribute to the properties of the hologram. In this case, mechanical properties and the like of the hologram are mainly governed by the heat curing resin and the polymerization product of the photopolymerizable monomer species.

The glass transition temperature of the thermoplastic resin is 200° C. or below, preferably 170° C. or below. When the glass transition temperature exceeds 200° C., the diffusion migration capability of the reactive monomer species is so low that there is a high possibility that the refractive index modulation level of the hologram is disadvantageously less than 0.04.

The thermoplastic resin is not particularly limited so far as it is compatible with the following heat curing resin. Specific examples of thermoplastic resins usable herein include, for example, poly(meth)acrylic esters or partial hydrolyzates thereof, polyvinyl acetates or partial hydrolyzates thereof, polyvinyl alcohols or partial acetalization product thereof, triacetylcellulose, polyisoprenes, polybutadienes, polychloroprenes, polyvinyl chlorides, polyallylates, chlorinated polyethylenes, chlorinated polypropylenes, poly-N-vinylcarbazoles or derivatives thereof, poly-N-vinylpyrrolidones or derivatives thereof, a copolymer of styrene with maleic anhydride or its semiester, or copolymers produced by using, as a comonomer, at least one monomer selected from the group consisting of copolymerizable monomers, for example, acrylic acid, an acrylic ester, acrylamide, acrylonitrile, ethylene, propylene, vinyl chloride, or vinyl acetate. These thermoplastic resins may be used either solely or as a mixture of two or more.

The heat curing resin used in the binder resin is not particularly limited so far as it is compatible with the above thermoplastic resin. Heat curing resins using three-dimensionally crosslinkable reactive monomers as a monomer unit are suitable.

Suitable three-dimensionally crosslinkable reactive monomers include curable group-containing reactive monomers and oligomers. Further, a copolymer of a curable group-containing monomer with a different type of monomer may also be used. Furthermore, a curable group may be introduced into a functional group-containing monomer or polymer. Specific examples thereof include polyacrylic esters (CP series, manufactured by Nippon Oils & Fats Co., Ltd.) such as glycidyl group-containing polymers and oxetanyl group-containing polymers.

Oligomer-type curable resin may also be used. Examples of such resins include, but are not limited to, epoxy compounds produced, for example, by a condensation reaction of various phenol compounds such as bisphenol A, bisphenol S, novolak, o-cresol novolak, or p-alkylphenol novolak, with epichlorohydrin.

Organic-inorganic hybrid polymers utilizing a sol-gel reaction may also be suitable as the binder resin used in the present invention. An example of the organic-inorganic hybrid polymer is a copolymer of a polymerizable group-containing organometal compound represented by formula (I) with a vinyl monomer.

$$R_mM(OR')_n \qquad (I)$$

wherein M represents a metal such as Si (silicon), Ti (titanium), Zr (zirconium), Zn (zinc), In (indium), Al (aluminum), or Sn (tin); R represents a vinyl or (meth)acryloyl group having 1 to 10 carbon atoms; R' represents an alkyl group having 1 to 10 carbon atoms; and m+n is the valence of the metal M.

Examples of compounds in the case where the metal atom M is Si, include vinyltriethoxysilane, vinylmethoxysilane, vinyltributoxysilane, vinyltriallyloxysilane, or (meth)acryloxypropyltrimethoxysilane. Examples of vinyl monomers usable in the organic-inorganic hybrid polymer include, but are not limited to, (meth)acrylic acid and (meth)acrylic esters.

When a binder resin comprising the heat curing resin and 0 to 25% by weight of the thermoplastic resin is used, the Young's modulus of a cured product of the photosensitive composition is not less than 600 MPa at 120° C. The mechanical strength of the cured product can be improved by optimizing the type of the heat curing resin and the content of the thermoplastic resin. The Young's modulus of the cured product is more preferably not less than 650 MPa at 120° C.

(2) Photopolymerizable Monomer

Photopolymerizable monomers constituting the photosensitive composition for volume hologram recording according to the present invention include photoradically polymerizable compounds, photocationically polymerizable compounds, or photodimerizable compounds. The content of these photopolymerizable compounds is 10 to 1000 parts by weight, preferably 10 to 200 parts by weight, based on 100 parts by weight of the binder resin.

Photoradically polymerizable compounds include compounds having at least one addition polymerizable ethylenically unsaturated double bond. Specific examples of photoradically polymerizable compounds include unsaturated carboxylic acids and salts thereof, esters of unsaturated carboxylic acids with aliphatic polyhydric alcohol compounds, and amide bonded products between unsaturated carboxylic acids and aliphatic polyamine compounds. More specific examples thereof include monomers of esters of aliphatic polyhydric alcohol compounds with unsaturated carboxylic acids. Acrylic esters include, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate, polyester acrylate oligomer, 2-phenoxyethyl acrylate, 2-phenoxymethyl acrylate, phenol ethoxylate monoacrylate, 2-(p-chlorophenoxy)ethyl acrylate, p-chlorophenyl acrylate, phenyl acrylate, 2-phenylethyl acrylate, (2-acryloxyethyl)ether of bisphenol A, ethoxylated bisphenol A diacrylate, 2-(1-naphthyloxy)ethyl acrylate, o-biphenyl acrylate, o-biphenyl acrylate, 9,9-bis(4-acryloxydiethoxyphenyl)fluorene, 9,9-bis(4-acryloxytriethoxyphenyl)fluorene, 9,9-bis(4-acryloxydipropoxyphenyl)fluorene, 9,9-bis(4-acryloxyethoxy-3-methylphenyl)fluorene, 9,9-bis(4-acryloxyethoxy-3-ethylphenyl)fluorene, and 9,9-bis(4-acryloxyethoxy-3,5-dimethyl)fluorene.

Further, sulfur-containing acrylic compounds disclosed in Japanese Patent Laid-Open No. 72748/1986 may also be used. Examples thereof include, but are not limited to, 4,4'-bis(β-acryloyloxyethylthio)diphenylsulfone, 4,4'-bis(β-acryloyloxyethylthio)diphenylketone, 4,4'-bis(β-acryloyloxyethylthio)-3,3',5,5'-tetrabromodiphenylketone, and 2,4-bis(β-acryloyloxyethylthio)diphenylketone.

Specific examples of methacrylic esters include such compounds that, among the above acrylic ester compounds, "methacrylate" has been substituted for "acrylate," "methacryloxy" has been substituted for "acryloxy," and "methacryloyl" has been substituted for "acryloyl."

Photocationically polymerizable comounds include cyclic ethers, thioethers and vinyl ethers of which the cyclic part is typically an epoxy ring or an oxetane ring. Specific examples thereof include epoxy ring-containing compounds. Examples of such compounds include, but are not limited to, polyalkylene glycol diglycidyl ether, bisphenol A diglycidyl ether, glycerin triglycidyl ether, diglycerol triglycidyl ether, diglycidyl hexahydrophthalate, trimethylolpropane diglycidyl ether, allyl glycidyl ether, phenyl glycidyl ether, and cyclohexene oxide.

Compounds produced by modifying the surface of metallic fine particles with a reactive group may also be used. Examples of such metallic fine particles include fine particles of Ti, Zr, Zn, In, and Sn having a high refractive index. The photopolymerization may be carried out by the above-described radical polymerization or cationic polymerization. At least one addition polymerizable ethylenically unsaturated double bond may be mentioned as the photoradically polymerizable functional group. The photoradically polymerizable functional group can be introduced by the treatment of a metal surface, for example, with an ethylenically unsaturated double bond-containing silane coupling agent. Ethylenically unsaturated double bond-containing silane coupling agents usable herein include, but are not limited to, the above vinylsilanes and (meth)acryloylsilanes.

Photocationically polymerizable functional groups include cyclic ethers, thioethers and vinyl ethers of which the cyclic part is typically an epoxy ring or an oxetane ring. The photocationically polymerizable functional group may be introduced by the treatment of a metal surface, for example, with an epoxy ring-containing silane coupling agent. Epoxy ring-containing silane coupling agents usable herein include, but are not limited to, β-(3,4-epoxycyclohexyl)ethyltrimethoxysilane and γ-glycidoxypropyltrimethoxysilane.

(3) Photopolymerization Initiator

Photoradical polymerization initiators or photocationic polymerization initiators according to the present invention may be used as the polymerization initiator constituting the photosensitive composition for volume hologram recording.

The content of the photopolymerization initiator is 0.1 to 20 parts by weight, preferably 5 to 15 parts by weight, based on 100 parts by weight of the binder resin.

Photoradical polymerization initiators include, but are not limited to, imidazole derivatives, bisimidazole derivatives, N-arylglycine derivatives, organic azide compounds, titanocenes, aluminate complexes, organic peroxides, N-alkoxypyridinium salts, and thioxanthone derivatives. More specific examples thereof include 1,3-di(t-butyldioxycarbonyl)benzophenone, 3,3',4,4'-tetrakis(t-butyldioxycarbonyl)benzophenone, 3-phenyl-5-isoxazolone, 2-mercaptobenzimidazole, bis(2,4,5-triphenyl)imidazole, 2,2-dimethoxy-1,2-diphenylethan-1-one (tradename: Irgacure 651, manufactured by Ciba Specialty Chemicals, K.K.), 1-hydroxy-cyclohexyl-phenyl-ketone (tradename: Irgacure 184, manufactured by Ciba Specialty Chemicals, K.K.), 2-benzyl-2-dimethylamino-1-(4-morpholinophenyl)-butanone-1 (tradename: Irgacure 369, manufactured by Ciba Specialty Chemicals, K.K.), and bis($\eta$5-2,4-cyclopentadien-1-yl)-bis(2,6-difluoro-3-(1H-pyrrol-1-yl)-phenyl)titanium (tradename: Irgacure 784, manufactured by Ciba Specialty Chemicals, K.K.).

Photocationic polymerization initiators include, but are not limited to, for example, sulfonic esters, imidosulfonates, dialkyl-4-hydroxysulfonium salts, p-nitrobenzyl arylsulfonates, silanol-aluminum complexes, ($\eta$6-benzene)($\eta$5-cyclopentadienyl)iron(II), and more specific examples thereof include, but are not limited to, benzoin tosylate, 2,5-dinitrobenzyl tosylate, and N-tosyphthalic acid imide.

Compounds usable as both the photoradical polymerization initiator and the photocationic polymerization initiator include, but are not limited to, aromatic iodonium salts, aromatic sulfonium salts, aromatic diazonium salts, aromatic phosphonium salts, triazine compounds, iron arene complexes. More specific examples thereof include, but are not limited to, chlorides, bromides, and borofluorides of iodoniums such as diphenyl iodonium, ditolyl iodonium, bis(p-tert-butylphenyl)iodonium, and bis(p-chlorophenyl)iodonium; iodonium salts of hexafluorophosphates, hexafluoroantimonates and the like; chlorides, bromides, and borofluorides of sulfoniums such as triphenyl sulfonium, 4-tert-butyltriphenylsulfonium, and tris(4-methylphenyl)sulfonium; sulfonium salts of hexafluorophosphates, hexafluoroantimonates and the like; and 2,4,6-substituted-1,3,5-triazine compounds, such as 2,4,6-tris(trichloromethyl)-1,3,5-triazine, 2-phenyl-4,6-bis(trichloromethyl)-1,3,5-triazine, and 2-methyl-4,6-bis(trichloromethyl)-1,3,5-triazine.

Preferably, the photopolymerization initiator is decomposed after hologram recording from the viewpoint of stabilizing the recorded hologram.

(4) Sensitizing Dyes

The sensitizing dye constituting the photosensitive composition for the volume hologram recording according to the present invention plays the role of increasing the sensitivity of the photopolymerization initiator to recording light. Specific examples of such sensitizing dyes include thiopyrilium salt dyes, merocyanine dyes, quinoline dyes, styrylquinoline dyes, ketocoumarin dyes, thioxanthene dyes, xanthene dyes, oxonol dyes, cyanine dyes, rhodamine dyes, pyrilium salt dyes, cyclopentanone dyes, and cyclohexanone dyes. Specific examples of cyanine and merocyanine dyes include 3,3'-dicarboxyethyl-2,2'-thiocyanine bromide, 1-carboxymethyl-1'-carboxyethyl-2,2'-quinocyanine bromide, 1,3'-diethyl-2, 2'-quinothiacyanine iodide, 3-ethyl-5-[(3-ethyl-2(3H)-benzothiazolylidene)ethylidene]-2-thioxo-4-oxazolidine, and 3,9-diethyl-3'-carboxymethyl-2,2'-thiacarbocyanine iodide. Specific examples of coumarin and ketocoumarin dyes include, but are not limited to, 3-(2'-benzoimidazole)-7-diethylaminocoumarin, 3,3'-carbonylbis(7-diethylaminocoumarin), 3,3'-carbonylbiscoumarin, 3,3'-carbonylbis(5,7-dimethoxycoumarin), and 3,3'-carbonylbis(7-acetoxycoumarin).

In the case of, for example, optical elements which are required to be highly transparent, preferably, at the time of post-process after hologram recording, or heating or ultraviolet irradiation, the visible light sensitizing dye is rendered colorless, for example, by decomposition.

The content of the sensitizing dye is 0.01 to 10 parts by weight, preferably 0.01 to 3 parts by weight, based on 100 parts by weight of the binder resin.

The photosensitive composition for volume hologram recording is used as a coating liquid by dissolving it in a solvent. Solvents usable herein include, but are not limited to, acetone, methyl ethyl ketone, methyl isobutyl ketone, cyclohexanone, benzene, toluene, xylene, chlorobenzene, tetrahydrofuran, methylcellosolve, ethylcellosolve, methylcellosolve acetate, ethylcellosolve acetate, ethyl acetate, 1,4-dioxane, 1,2-dichloroethane, dichloromethane, chloroform, methanol, ethanol, and isopropanol.

Photosensitive Medium for Volume Hologram Recording

Next, the photosensitive medium for volume hologram recording using the above composition for volume hologram recording will be described.

The photosensitive medium for volume hologram recording is formed by coating the coating liquid comprising the composition onto a base material, for example, by a spin coater, a gravure coater, a Komma coater, or a bar coater and drying the coating to form a photosensitive layer.

The base material used in the photosensitive medium for volume hologram recording is not particularly limited, and examples of suitable base materials include resin films, for example, polyethylene films, polypropylene films, polyethylene fluoride films, polyvinylidene fluoride films, polyvinyl chloride films, polyvinylidene chloride films, ethylene-vinyl alcohol films, polyvinyl alcohol films, polymethyl methacrylate films, polyethersulfone films, polyether ether ketone films, polyamide films, tetrafluoroethylene-perfluoroalkyl vinyl ether copolymer films, polyester films such as polyethylene terephthalate films, and polyimide films. As will be described later, the base material should of course have transparency on such a level that hologram recording is possible. That is, the base material is not required to be transparent to light at all wavelengths, and transmission of at least recording wavelength suffices for the present invention. The transmittance of the recording wavelength may be about several %.

The film thickness of the base material is 2 to 200 μm, preferably 10 to 50 μm. Regarding the coverage of the composition, the thickness of the coating film after coating and drying is preferably 1 to 100 μm, particularly preferably 10 to 40 μm. When the coating film after drying is tacky, a construction may be adopted in which a film exemplified above as the base material is used as a protective film and is laminated onto the coated face. In this case, the surface of contact between the laminate film and the coated face may have been subjected to releasing treatment for easy separation in a later stage.

Method for Volume Hologram Recording

Visible laser beams, for example, argon ion laser (458 nm, 488 nm, and 514.5 nm), krypton ion laser (647.1 nm), helium-neon ion laser (633 nm), and YAG laser (532 nm) may be used as laser beams for hologram recording. Volume holograms may be recorded using these laser beams in the photosensitive medium for volume hologram recording.

The volume hologram may be recorded in the photosensitive medium for volume hologram recording by any conventional method.

For example, a volume hologram is recorded by bringing a master hologram into intimate contact with the hologram recording material layer in the photosensitive medium for volume hologram recording and then subjecting the assembly to interference exposure from the transparent base material film side using visible light, or ultraviolet light, electron beam or other ionizing radiation.

After the interference exposure, treatment such as whole image exposure using ultraviolet light or heating may be properly carried out to accelerate the refractive index modulation and to complete the polymerization reaction.

The volume hologram with a hologram recorded therein is excellent in the brightness of the hologram, as well as in heat resistance and mechanical strength. Among others, a high hologram brightness of not less than 0.04 in terms of refractive index modulation level $\Delta n$ can be realized. Further, since the heat resistance is also excellent, even after heating of the volume hologram at 120° C., the diffraction efficiency is not substantially lowered and, according to the present invention, the lowering of the diffraction efficiency is not more than 10%.

EXAMPLES

Example 1

The following binder resin for a volume hologram photosensitive composition was provided.

| | |
|---|---|
| Heat curing resin | 35 wt % |
| Epoxy group-containing acrylic resin; Blemmer CP-50M (manufactured by Nippon Oils & Fats Co., Ltd.) (weight-average molecular weight 10,000, epoxy equivalent 310 g/eq.) | |

A volume hologram photosensitive composition was prepared using the above binder resin and the following materials.

| | |
|---|---|
| 1,6-Hexanediol diglycidyl ether (Denacol EX-212; manufactured by Nagase ChemteX Corporation) | 25 wt % |
| Diphenoxyethanol fluorene diacrylate (BPEFA; manufactured by Osaka Gas Chemicals Co., Ltd.) | 35 wt % |
| Diaryl idonium salt (PI2074: manufactured by Rhodia) | 4 wt % |
| 2,5-Bis(4-diethylaminobenzylidene)cyclopentanone | 1 wt % |
| Methyl isobutyl ketone | 100 wt % |
| 1-Butanol | 100 wt % |

The volume hologram photosensitive composition thus obtained was coated onto a 50 μm-thick polyethylene terephthalate (PET) film (Lumirror 50T60, manufactured by Toray Industries, Inc.) by an applicator to a thickness of 10 μm on a dry basis to produce a photosensitive medium for volume hologram recording.

The photosensitive medium on its coated face side was laminated onto a mirror, and a volume hologram was recorded by applying a 532 nm laser beam to the photosensitive medium at 80 mJ/cm$^2$ through PET side. After recording, the photosensitive medium was separated from the mirror, and 50 μm-thick PET was laminated onto the photosensitive layer side. Subsequently, the assembly was heated, and the whole area of the assembly was irradiated with ultraviolet light to fix the photosensitive composition layer. Thus, a volume hologram 1 was prepared.

Example 2

A volume hologram 2 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 31.5 wt % |
| Thermoplastic resin<br>Polyvinyl acetate; DENKA SAKNOHOL SN-08H (manufactured by Denki Kagaku Kogyo K.K.) (degree of polymerization 800) | 3.5 wt % |

Example 3

A volume hologram 3 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 28 wt % |
| Thermoplastic resin<br>Polyvinyl acetate; DENKA SAKNOHOL SN-08H (manufactured by Denki Kagaku Kogyo K.K.) (degree of polymerization 800) | 7 wt % |

Example 4

A volume hologram 4 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 24.5 wt % |
| Thermoplastic resin<br>Polyvinyl acetate; DENKA SAKNOHOL SN-08H (manufactured by Denki Kagaku Kogyo K.K.) (degree of polymerization 800) | 10.5 wt % |

Example 5

A volume hologram 5 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 21 wt % |
| Thermoplastic resin<br>Polyvinyl acetate; DENKA SAKNOHOL SN-08H (manufactured by Denki Kagaku Kogyo K.K.) (degree of polymerization 800) | 14 wt % |

Example 6

A volume hologram 6 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 17 wt % |
| Thermoplastic resin<br>Polyvinyl acetate; DENKA SAKNOHOL SN-08H (manufactured by Denki Kagaku Kogyo K.K.) (degree of polymerization 800) | 17 wt % |

Example 7

A volume hologram 7 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 14 wt % |
| Thermoplastic resin<br>Polyvinyl acetate; DENKA SAKNOHOL SN-08H (manufactured by Denki Kagaku Kogyo K.K.) (degree of polymerization 800) | 21 wt % |

Example 8

A volume hologram 8 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats Co., Ltd.) (weight-average molecular weight 10,000, epoxy equivalent 310 g/eq.) | 10.5 wt % |
| Thermoplastic resin<br>Polyvinyl acetate; DENKA SAKNOHOL SN-08H (manufactured by Denki Kagaku Kogyo K.K.) (degree of polymerization 800) | 24.5 wt % |

Comparative Example 1

A volume hologram 9 was prepared in the same manner as in Example 1, except that the following binder resin for a volume hologram photosensitive composition was used.

| | |
|---|---|
| Heat curing resin<br>Epoxy group-containing acrylic resin; Blemmer CP-50M (manufactured by Nippon Oils & Fats | 7 wt % |

-continued

| | |
|---|---|
| Co., Ltd.) (weight-average molecular weight 10,000, epoxy equivalent 310 g/eq.) Thermoplastic resin Polyvinyl acetate; DENKA SAKNOHOL SN-08H (manufactured by Denki Kagaku Kogyo K.K.) (degree of polymerization 800) | 28 wt % |

Comparative Example 2

A volume hologram 10 was prepared in the same manner as in Example 1, except that the following binder resin for a volume hologram photosensitive composition was used.

| | |
|---|---|
| Heat curing resin Epoxy group-containing acrylic resin; Blemmer CP-50M (manufactured by Nippon Oils & Fats Co., Ltd.) (weight-average molecular weight 10,000, epoxy equivalent 310 g/eq.) | 3.5 wt % |
| Thermoplastic resin Polyvinyl acetate; DENKA SAKNOHOL SN-08H (manufactured by Denki Kagaku Kogyo K.K.) (degree of polymerization 800) | 31.5 wt % |

Comparative Example 3

A volume hologram 11 was prepared in the same manner as in Example 1, except that the following binder resin for a volume hologram photosensitive composition was used.

| | |
|---|---|
| Thermoplastic resin Polyvinyl acetate; DENKA SAKNOHOL SN-08H (manufactured by Denki Kagaku Kogyo K.K.) (degree of polymerization 800) | 35 wt % |

Volume holograms 1 to 11 prepared in Examples 1 to 8 and Comparative Examples 1 to 3 were evaluated for hologram properties and hot press resistance and were measured for Young's modulus as follows.

(1) Evaluation of Hologram Recording Properties

For the volume holograms 1 to 11, the transmittance was measured with a spectrophotometer (UV-2450, manufactured by Shimadzu Seisakusho Ltd.), and a spectral transmittance curve was prepared.

In the spectral transmittance curve, as shown in FIG. 1, peak transmittance A and base transmittance B were determined, and the diffraction efficiency was calculated by the following formula:

Diffraction efficiency $\eta = |B-A|/B (\%)$

Further, $\Delta n$ was calculated using the value of the diffraction efficiency $\eta$ obtained above by the following Kogelnik's theoretical formula:

$\eta = \tan h^2(\pi(\Delta n)d/\lambda \cos \theta_0)$ wherein $\eta$ represents diffraction efficiency; d represents the thickness of the sensitive material; $\lambda$ represents the wavelength of recording laser; and $\theta_0$ represents the incidence angle of recording laser light into the sensitive material. The thickness d of the sensitive material was measured by separating the PET film from both sides of the volume holograms 1 to 11 prepared above and measuring the thickness of the hologram layer per se with a micrometer.

Various property values thus obtained were as shown in Table 1 below.

(2) Evaluation of Hot Press Resistance

Each of the volume holograms 1 to 11 was hot pressed with a hot stamper (V-08, manufactured by NAVITAS CO., LTD.) under conditions of preset temperature 150° C., hot pressing time 0.5 sec, and pressing pressure 125 kgf/cm². In this case, the surface temperature of the volume holograms 1 to 11 was measured with a K thermocouple and was found to be 120° C.

For the hot pressed volume holograms, the hologram recording properties were calculated in the same manner as described above, and the difference in property values between before and after hot pressing was calculated.

The results were as shown in Table 1.

(3) Measurement of Young's Modulus

Each of the volume holograms 1 to 11 was taken off into a size of about 15 mm×25 mm. The polyester (PET) film on one side was separated. Thereafter, an instantaneous adhesive was dropped on a slide glass which was then put on top of the other PET side of the volume hologram, followed by standing to prepare a test piece for the measurement of Young's modulus.

For the test piece, the Young's modulus of the volume hologram was measured using a Vickers-type needle of a surface film property tester (film hardness meter) (H100VP X-Y PROG; manufactured by H. FISCHER) under conditions of maximum load 300 mN, load holding time 10 sec, and load condition d√(F)/dt=constant at 25° C. and 120° C.

The results were as shown in Table 1 below.

TABLE 1

| | Mixing amount of thermoplastic resin (wt %) | Properties of hologram | | Diffraction efficiency (%) | | Young's modulus | |
|---|---|---|---|---|---|---|---|
| | | Diffraction efficiency (%) | $\Delta n$ (–) | After hot pressing | Difference between before and after hot pressing | 25° C. (MPa) | 120° C. (MPa) |
| Example 1 | 0 | 56.6 | 0.044 | 55.6 | 1 | 4585 | 1952 |
| Example 2 | 3.5 | 69.8 | 0.045 | 66.1 | 3.7 | 4425 | 950 |
| Example 3 | 7.0 | 74.3 | 0.047 | 72.5 | 1.8 | 4112 | 885 |
| Example 4 | 10.5 | 75.8 | 0.046 | 71.4 | 4.4 | 3837 | 769 |
| Example 5 | 14.0 | 78.1 | 0.047 | 76.6 | 1.5 | 3619 | 713 |
| Example 6 | 17.0 | 78.6 | 0.048 | 75.0 | 3.6 | 3650 | 734 |
| Example 7 | 21.0 | 81.8 | 0.050 | 79.4 | 2.4 | 3229 | 737 |
| Example 8 | 24.5 | 82.5 | 0.050 | 80.3 | 2.2 | 2728 | 663 |
| Comparative Example 1 | 28.0 | 83.9 | 0.049 | 70.6 | 13.3 | 2618 | 598 |

TABLE 1-continued

|  | Mixing amount of thermoplastic resin (wt %) | Properties of hologram | | Diffraction efficiency (%) | | Young's modulus | |
|---|---|---|---|---|---|---|---|
|  |  | Diffraction efficiency (%) | Δn (—) | After hot pressing | Difference between before and after hot pressing | 25° C. (MPa) | 120° C. (MPa) |
| Comparative Example 2 | 31.5 | 85.2 | 0.050 | 56.9 | 28.3 | 2355 | 557 |
| Comparative Example 3 | 35.0 | 89.1 | 0.050 | 23.3 | 65.8 | 2136 | 494 |

The invention claimed is:

1. A volume hologram photosensitive composition comprising at least a photopolymerizable monomer, a photopolymerization initiator, a sensitizing dye for sensitizing the initiator, and a binder resin, wherein
the binder resin comprises a heat curing resin and a thermoplastic resin, and
the thermoplastic resin is contained in an amount of 10 to 25% by weight based on the total solid content of the photosensitive composition.

2. The volume hologram photosensitive composition according to claim 1, wherein the Young's modulus of a cured product of the photosensitive composition is not less than 600 MPa at 120° C.

3. The volume hologram photosensitive composition according to claim 1, wherein the heat curing resin comprises a monomer unit of a three-dimensionally crosslinkable reactive monomer.

4. The volume hologram photosensitive composition according to claim 3, wherein the reactive monomer is a glycidyl group-containing monomer or an oxetanyl group-containing monomer.

5. A photosensitive medium for volume hologram recording, comprising a base material and a photosensitive layer formed of a volume hologram photosensitive composition according to claim 1 provided on the base material.

6. A volume hologram using a photosensitive medium for volume hologram recording according to claim 5, the volume hologram having a refractive index modulation value Δn of not less than 0.04.

7. The volume hologram according to claim 6, wherein the difference in diffraction efficiency between before and after heating a fully cured or fixed volume hologram at 120° C. is not more than 10% when a treatment such as whole image exposure using ultraviolet light or heating is carried out for the volume hologram.

8. A volume hologram photosensitive composition according to claim 1, wherein the thermoplastic resin is contained in an amount of 3.5 to 24.5% by weight based on the total solid content of the photosensitive composition.

9. The volume hologram photosensitive composition according to claim 1, wherein said thermoplastic resin has a glass transition temperature of 170° C. or less.

10. A volume hologram photosensitive composition comprising at least a photopolymerizable monomer, a photopolymerization initiator, a sensitizing dye for sensitizing the initiator, and a binder resin, wherein
the binder resin comprises a heat curing resin and a thermoplastic resin, said heat curing resin comprising a monomer unit of a three-dimensionally crosslinkable reactive monomer,
the thermoplastic resin is contained in an amount of 10 to 25% by weight based on the total solid content of the photosensitive composition, and
the Young's modulus of a cured product of the photosensitive composition is not less than 600 MPa at 120° C.

11. The volume hologram photosensitive composition according to claim 10, wherein said thermoplastic resin has a glass transition temperature of 170° C. or less.

* * * * *